US006307617B1

(12) United States Patent
Nishiki et al.

(10) Patent No.: US 6,307,617 B1
(45) Date of Patent: Oct. 23, 2001

(54) INITIAL ALIGNMENT SYSTEM FOR USE IN MANUFACTURING AN OPTICAL FILTER

(75) Inventors: Akihiko Nishiki; Kozo Fujii, both of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/285,776

(22) Filed: Apr. 5, 1999

Related U.S. Application Data

(62) Division of application No. 09/113,152, filed on Jul. 10, 1998.

(30) Foreign Application Priority Data

Nov. 12, 1997 (JP) .................................... 9-310916

(51) Int. Cl.[7] .................................................. G03B 27/42
(52) U.S. Cl. .......................... 355/53; 385/37; 356/401; 430/22
(58) Field of Search ........................ 355/53; 356/401, 356/73.21; 430/22; 385/37, 12; 250/461.1

(56) References Cited

U.S. PATENT DOCUMENTS

| | | | |
|---|---|---|---|
| 4,506,947 | * | 3/1985 | Tatekura et al. ............... 350/96.1 |
| 4,608,494 | * | 8/1986 | Kobayashi et al. ............ 250/461.1 |
| 4,676,649 | * | 6/1987 | Phillips .......................... 356/401 |
| 5,367,588 | | 11/1994 | Hill et al. ....................... 385/37 |
| 5,862,273 | * | 1/1999 | Pelletier ......................... 385/12 |
| 5,914,207 | * | 6/1999 | Nishiki et al. ................. 430/22 |
| 6,038,358 | * | 3/2000 | Nishiki ........................... 385/37 |

OTHER PUBLICATIONS

Anderson et al., "Production of in–fibre gratings using a diffractive optical element", Electronics Letters, vol. 29, No. 6, Mar. 18, 1993, pp. 566–568.
Komukai et al., "Fabrication of high–quality fiber gratings by the fluorescence monitoring method", Ninth Meeting on Applied Fiber Optic Technology, pp. 1–4.
Inoue et al., Fiber Bragg grating and its applications, Oyo Butsuri, vol. 66, No. 1, 1997, pp. 33–36.

* cited by examiner

Primary Examiner—Russell Adams
Assistant Examiner—Raghuveer Bindingnavele
(74) Attorney, Agent, or Firm—Venable; Robert J. Frank; Michael A. Sartori

(57) ABSTRACT

An alignment system finds the coordinates of a first point on a photosensitive optical fiber by scanning an ultraviolet beam across the fiber several times at successively decreasing speeds and detecting light returned from the fiber. The coordinates of a second point on the fiber are found similarly. On the basis of the coordinates of the first and second points, the alignment system automatically aligns the fiber in a direction suitable for the formation of an optical filter in the fiber.

14 Claims, 14 Drawing Sheets

INITIAL ALIGNMENT SYSTEM FOR USE IN MANUFACTURING AN OPTICAL FILTER

This application is a division of Ser. No. 09/113,152 filed Jul. 10, 1998.

BACKGROUND OF THE INVENTION

The present invention relates to a method and system for aligning an ultraviolet beam and an optical fiber preparatory to the manufacture of an optical filter in the optical fiber.

Optical filters comprising Bragg gratings formed in optical fibers are useful for dispersion compensation in optical communication systems, and for various other applications. A known method of manufacturing such filters illuminates a photosensitive optical fiber with ultraviolet light through a phase mask, thereby imprinting a modulation pattern in the refractive index of the fiber core. To obtain uniform modulation, the manufacturing process preferably uses a highly stable ultraviolet light source, such as a continuous-wave argon ion laser apparatus emitting an ultraviolet beam by second harmonic generation.

The beam emitted by this type of light source is relatively weak. To increase the beam intensity, the beam is focused to a width comparable to the diameter of the optical fiber, and scanned lengthwise along the fiber. The fiber diameter is only about one hundred twenty-five micrometers (125 $\mu$m), so successful scanning requires careful alignment between the beam and the fiber. In particular, the fiber must be accurately aligned at the beginning of the scan, so that the fiber is centered under the beam and the fiber axis is aligned in the scanning direction.

During the scanning process, alignment can be maintained by the known method of monitoring visible light produced by fluorescence when the core of the optical fiber is illuminated by the ultraviolet beam. Some of this visible light propagates through the fiber core, and can be measured by an optical power meter connected to one end of the optical fiber. The measured value can be fed back to an automatic positioning system that keeps the beam centered on the fiber core.

It would be advantageous if the initial alignment of the fiber could also be carried out by automatic control.

SUMMARY OF THE INVENTION

It is accordingly an object of the present invention to align a photosensitive optical fiber automatically, in an initial position suitable for scanning with an ultraviolet beam to form an optical filter.

Another object of the invention is to align the photosensitive optical fiber accurately.

The invented alignment method comprises the steps of:
(a) holding the photosensitive optical fiber in a plane having an X-axis and a Y-axis;
(b) scanning the ultraviolet beam repeatedly across the photosensitive optical fiber, parallel to the Y-axis, at successively decreasing speeds;
(c) detecting light returned from the photosensitive optical fiber;
(d) thereby determining first X- and Y-coordinates at which the photosensitive optical fiber is centered under the ultraviolet beam;
(e) repeating steps (b) and (c) at a different location on the photosensitive optical fiber, thereby determining second X- and Y-coordinates at which the photosensitive optical fiber is centered under the ultraviolet beam; and
(f) rotating the photosensitive optical fiber through an angle determined from the first and second X- and Y-coordinates.

The invented method preferably comprises the additional steps of:
(g) repeating steps (b) and (c) again after step (f), thereby determining a third Y-coordinate at which the photosensitive optical fiber is centered under the ultraviolet beam; and
(h) moving the photosensitive optical fiber parallel to the Y-axis according to the third Y-coordinate, thereby aligning the photosensitive optical fiber with the ultraviolet beam.

When step (b) is carried out, the scans can be performed in identical directions, or at least two of the scans can be performed in mutually opposite directions. In either case, the scans can be performed at a fixed X-coordinate, or at different X-coordinates.

The Y-coordinate in step (d) can be determined from the last scan in step (b), or from the last two scans in step (b). In either case, the Y-coordinate can determined by finding a coordinate at which peak light power is detected during a scan, or by finding a coordinate centered between a pair of half-power coordinates.

The invented alignment system comprises at least one fiber holder for holding the photosensitive optical fiber, a first scanning stage for scanning the ultraviolet beam parallel to the X-axis, a second scanning stage for scanning the ultraviolet beam parallel to the Y-axis, a third scanning stage for rotating the photosensitive optical fiber about an axis perpendicular to the X- and Y-axes, an optical transducer for detecting light returned from the photosensitive optical fiber when illuminated by the ultraviolet beam, and a computing device controlling the first, second, and third scanning stages to carry out the steps described above.

DETAILED DESCRIPTION OF THE INVENTION

Embodiments of the invention will be described with reference to the attached illustrative drawings, following a general description of the conventional method of using a phase mask to create an in-fiber Bragg grating.

Figure 1:
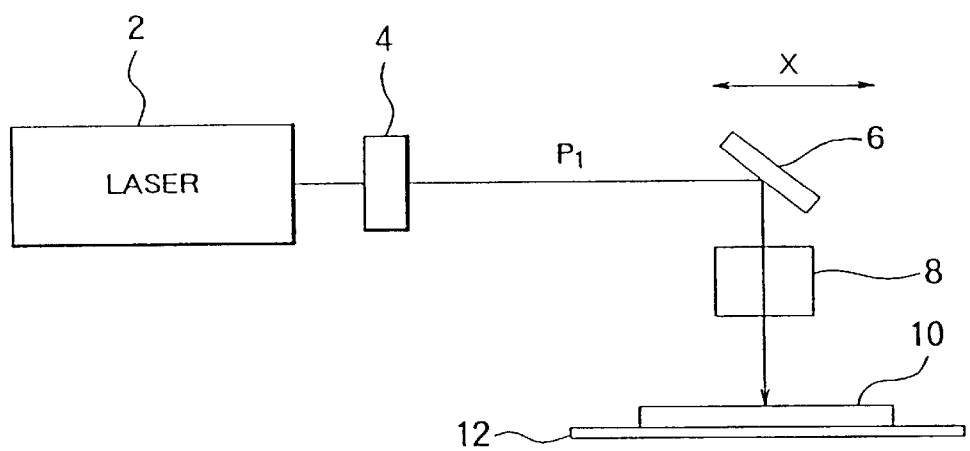
FIG. 1 is a schematic drawing of a conventional apparatus for imprinting an in-fiber Bragg grating.

FIG. 1 shows a conventional apparatus comprising a laser light source 2, an optical attenuator 4, a mirror 6, and a cylindrical lens 8 that focuses an ultraviolet beam $P_1$ through a phase mask 10 onto a photosensitive optical fiber 12. The mirror 6 and cylindrical lens 8 are movable in the direction of arrow X, this motion causing the ultraviolet beam to scan the photosensitive optical fiber 12 in the lengthwise direction. The optical attenuator 4 is necessary if a high-intensity laser light source is used, but may be omitted if a lower-intensity source such as an argon ion laser is used.

Figure 2:
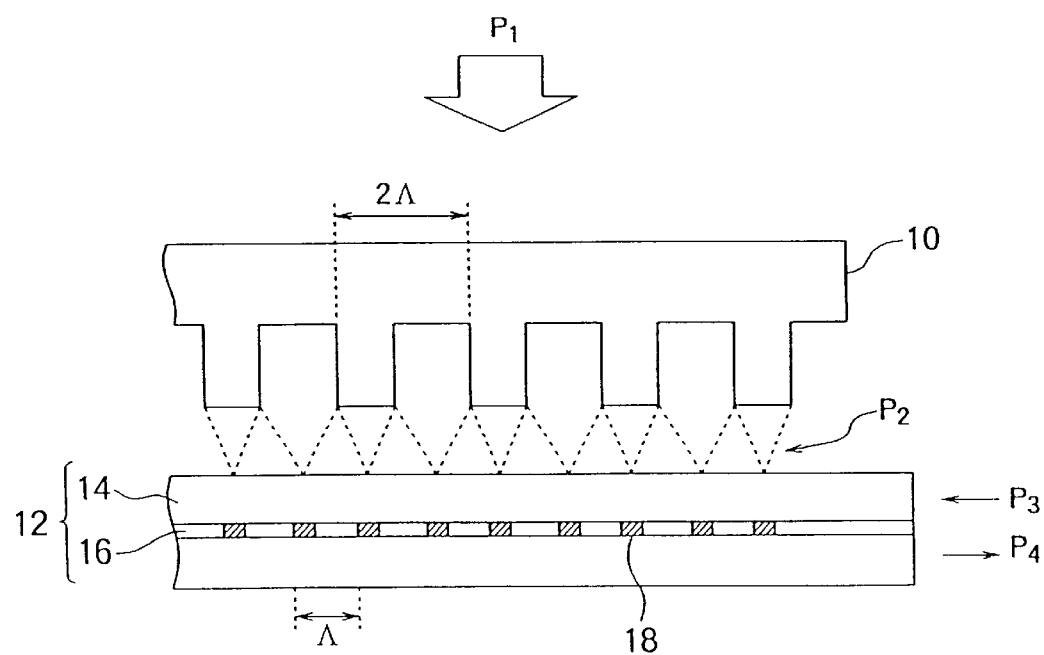
FIG. 2 is an enlarged sectional view of the phase mask and photosensitive optical fiber in FIG. 1.

Referring to FIG. 2, the photosensitive optical fiber 12 comprises a clad 14 and a photosensitive core 16. The core 16 is doped with germanium, so that its refractive index is alterable by exposure to ultraviolet light. The core may also be doped with hydrogen. The SMF-28 fiber manufactured by Corning, Incorporated, of Corning, N.Y., is an example of a suitable photosensitive optical fiber.

The lower surface of the phase mask 10 has a pattern of parallel corrugations forming a diffraction grating. The phase mask 10 can be fabricated by reactive ion etching of a silica glass substrate, using a thin-film chromium mask patterned by electron-beam photolithography.

Diffraction of the ultraviolet beam $P_1$ by the phase mask 10 produces a diffracted ultraviolet beam $P_2$ that illuminates the photosensitive optical fiber 12. If the grating pitch-of the phase mask 10 is 2Λ, then the diffracted ultraviolet beam P2 alternates between high and low intensity with a period of Λ. The refractive index of the fiber core 16 is most altered in regions 18 exposed to the high-intensity parts of the diffracted ultraviolet beam $P_2$. A Bragg grating with a grating pitch of Λ is thus created in the fiber core 16.

The Bragg grating selectively reflects light with a wavelength $\lambda_b$ given by the following formula, in which $n_{eff}$ is the effective refractive index of the fiber core 16.

$$\lambda_b = 2 \cdot n_{eff} \cdot \Lambda$$

If light $P_3$ with a plurality of wavelengths, including $\lambda_b$, is directed into the photosensitive optical fiber 12 from one end, the light $P_4$ of wavelength $\lambda_b$ is reflected back to the same end. The optical fiber 12 thus becomes a filter that extracts a particular wavelength $\lambda_b$.

Figure 3:
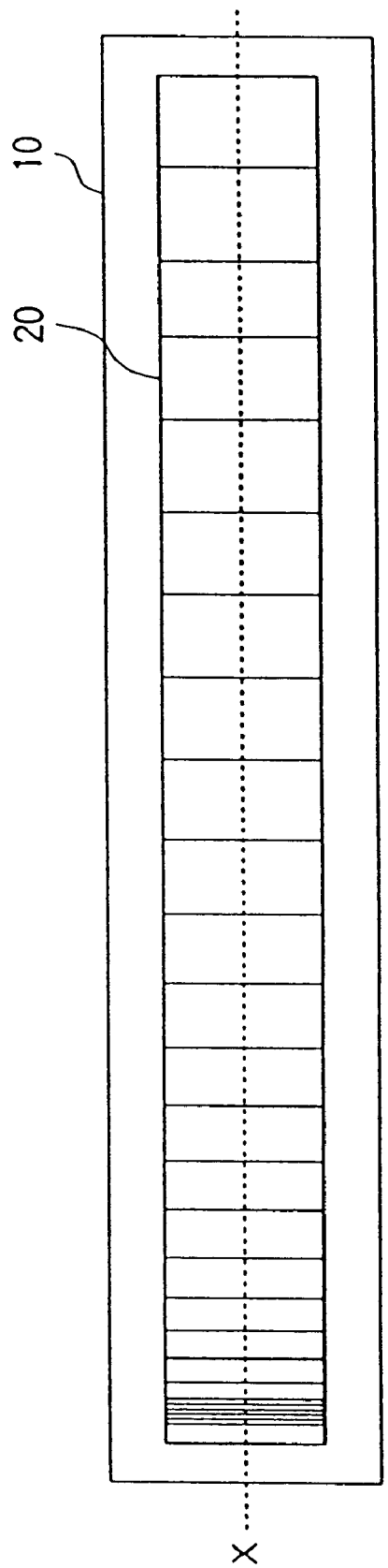
FIG. 3 is an enlarged plan view of the phase mask in FIG. 1.

Referring to FIG. 3, the phase mask 10 may have a chirped grating 20 with a grating pitch that varies, either continuously or in discrete steps. The grating 20 can be divided into zones, for example, and a different grating pitch can be employed in each zone, to create a filter that extracts a plurality of wavelengths.

Figure 4:
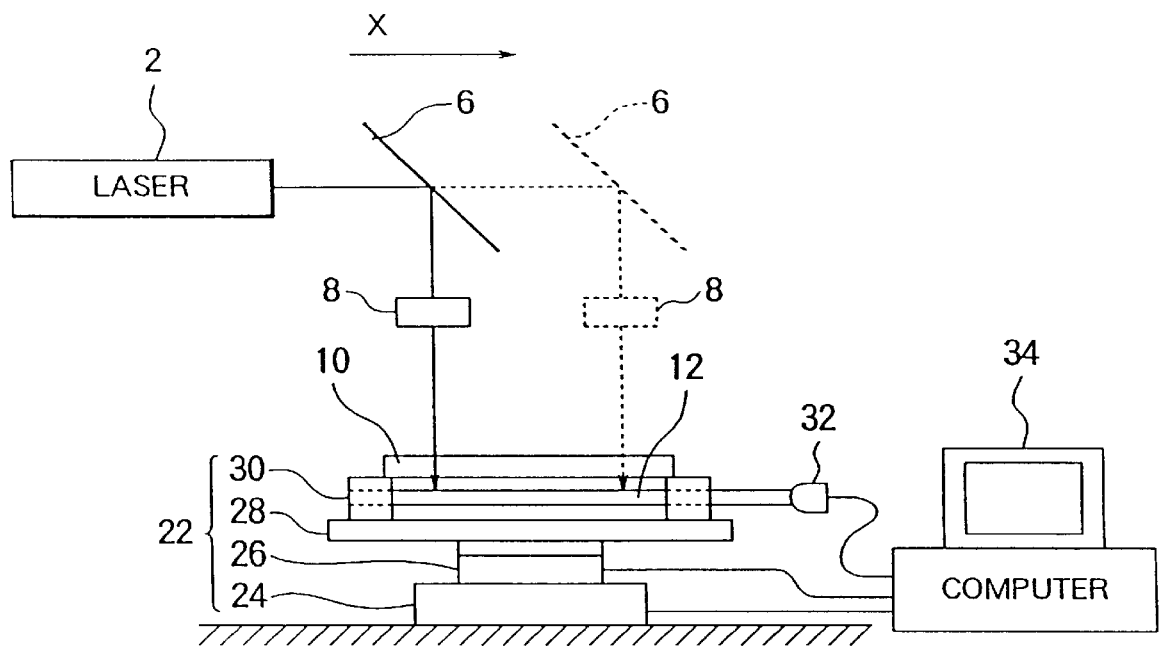
FIG. 4 is a side view illustrating an initial alignment system according to a first embodiment of the invention.

FIG. 4 illustrates an apparatus generally similar to the above, but employing a first embodiment of the invention for initial alignment of the ultraviolet beam and the optical fiber. The laser light source 2 is a continuous-wave argon ion laser such as the INNOVA 300 FRED laser manufactured by Coherent, Incorporated, of Santa Clara, Calif. An optical slit, omitted to simplify the drawing, extracts an ultraviolet beam $P_1$ with a width of, for example, six-tenths of a millimeter (0.6 mm). The mirror 6 and cylindrical lens 8 move in the direction indicated by arrow X. By focusing the ultraviolet beam, the cylindrical lens 8 reduces the beam width to substantially one hundred micrometers (100 μm). The phase mask 10 may have either a constant or a chirped grating pitch; a constant grating pitch will be assumed in the following description. The above-mentioned Corning SMF-28 fiber may be employed as the photosensitive optical fiber 12, or any other type of photosensitive optical fiber may be used, provided the fiber core fluoresces when illuminated by ultraviolet light.

The phase mask 10 and photosensitive optical fiber 12 are held by a Y-θ stage assembly 22 comprising a Y-axis translational stage 24, a θ-axis rotational stage 26, a base plate 28, and a pair of fiber holders 30. The Y-axis translational stage 24 is driven by a stepping motor (not visible) in a Y-axis direction perpendicular to the drawing sheet. The θ-axis rotational stage 26 is driven by another stepping motor (not visible), the axis of rotation being vertical in the drawing. The base plate 28 supports the fiber holders 30, which hold the phase mask 10 and photosensitive optical fiber 12. The photosensitive optical fiber 12 is held suspended above the base plate 28, so that the refractive index of the fiber core is not significantly affected by ultraviolet light reflected from the base plate 28. The phase mask 10 is held parallel to the photosensitive optical fiber 12.

One end of the photosensitive optical fiber 12 is coupled to an optical transducer 32 such as an optical power meter that converts visible light received from the photosensitive optical fiber 12 to a data signal indicating the received optical power level. The received light, having a wavelength of about four hundred nanometers (400 nm), is generated by fluorescence in the core of the optical fiber 12 when the core is illuminated by the ultraviolet beam. The optical transducer 32 is coupled by a cable such as a general-purpose interface bus cable to a computer 34 that controls the Y-axis translational stage 24 and θ-axis rotational stage 26.

Figure 5:
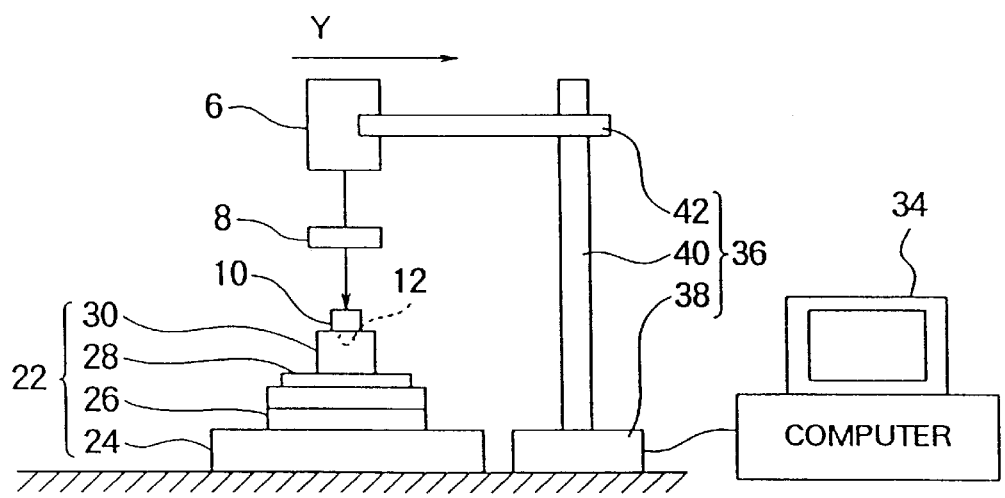
FIG. 5 is a frontal view illustrating the first embodiment.

Referring to FIG. 5, the apparatus also has an X-axis stage assembly 36 comprising an X-axis translational stage 38, a vertical column 40, and a horizontal arm 42 attached to the vertical column 40. The horizontal arm 42 supports the mirror 6 and cylindrical lens 8 (the physical attachment between the cylindrical lens 8 and horizontal arm 42 is omitted to simplify the drawing). Under control of the computer 34, the X-axis translational stage 38 moves the vertical column 40 and the horizontal arm 42, thereby producing the scanning motion indicated by the arrow X in FIG. 4. The scanning rate is controllable in the range from, for example, ten micrometers to one hundred millimeters per second (10 μm/s to 100 mm/s).

Figure 6:
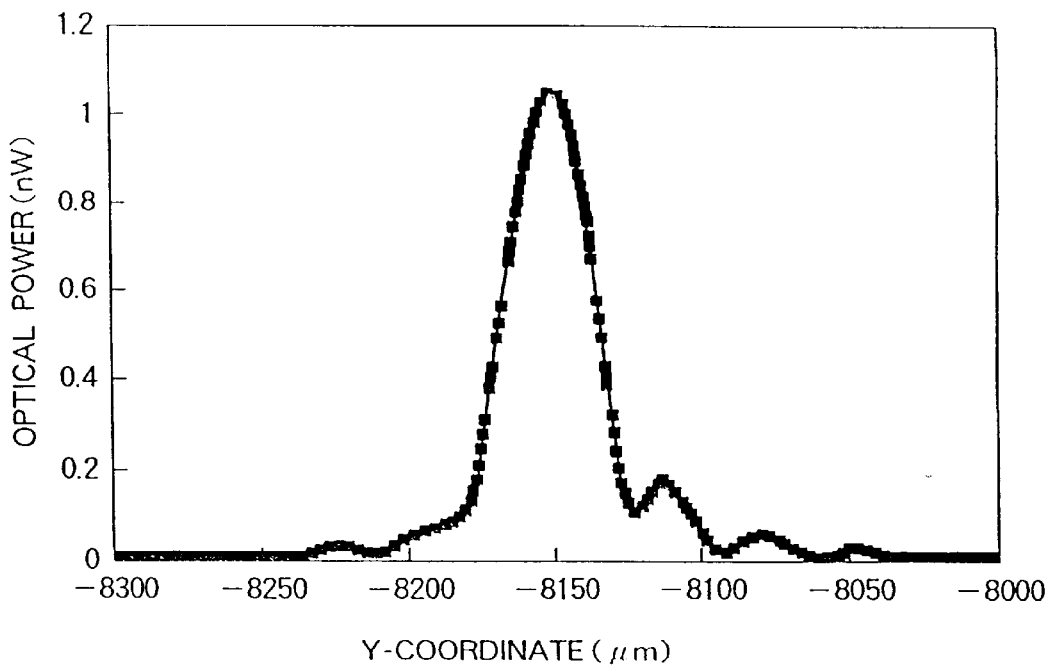
FIG. 6 is a graph illustrating the intensity profile of the ultraviolet beam.

FIG. 6 shows an intensity profile of the ultraviolet beam incident on the phase mask 10 and photosensitive optical fiber 12. Position on the Y-axis is indicated in micrometers on the horizontal axis; optical power is indicated in nanowatts on the vertical axis. The beam has a substantially Gaussian profile with a full width of about one hundred micrometers (100 μm).

Figure 7:
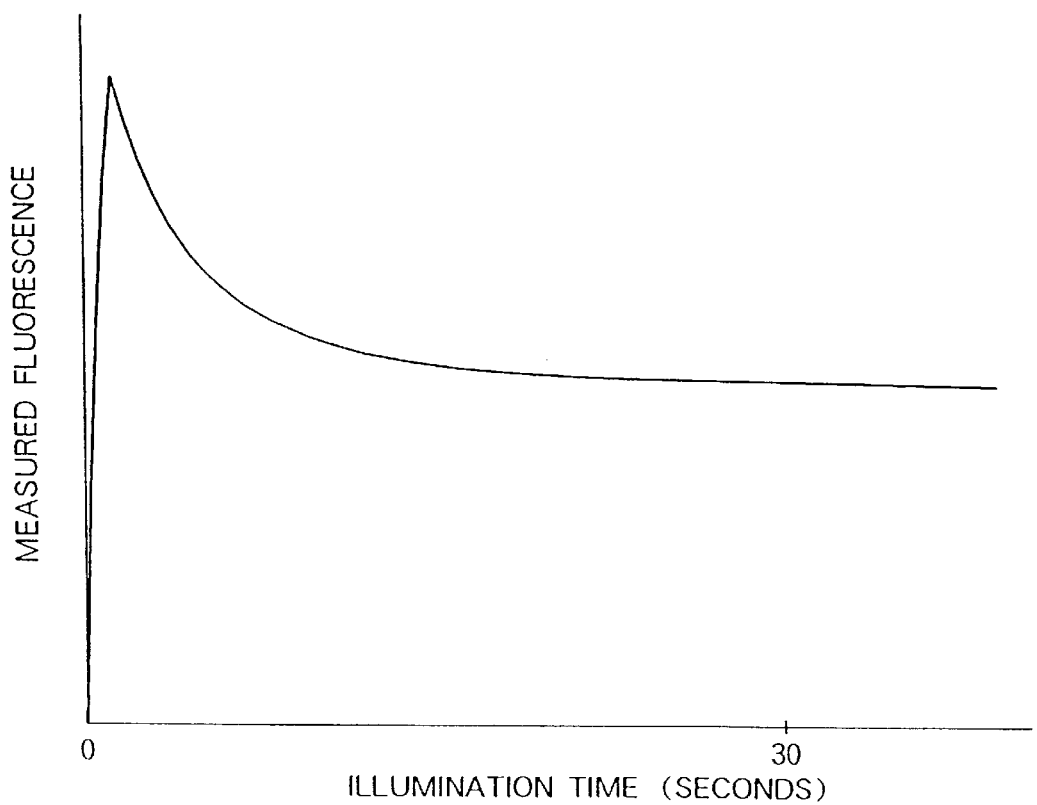
FIG. 7 is a graph illustrating changes in fluorescent emission over time.

FIG. 7 indicates how the intensity of the fluorescence varies over time when the photosensitive optical fiber 12 is illuminated at a single location by the ultraviolet beam. Illumination time is shown in seconds on the horizontal axis, and fluorescence as measured by the optical transducer 32 on the vertical axis. The optical power of the fluorescence rises to a peak level in about one second, then declines toward a stable level over about thirty seconds. The present invention is able to align the photosensitive optical fiber 12 accurately despite this varying fluorescence level.

The initial alignment procedure carried out by the first embodiment will next be described with reference to the flowcharts in FIGS. 8 and 9. In this procedure the computer 34 controls the X-axis translational stage 38 and Y-axis translational stage 24 according to X- and Y-coordinates denoting the point at which the ultraviolet beam $P_1$ is aimed on the base plate 28 of the Y-θ stage assembly 22.

Figure 8:
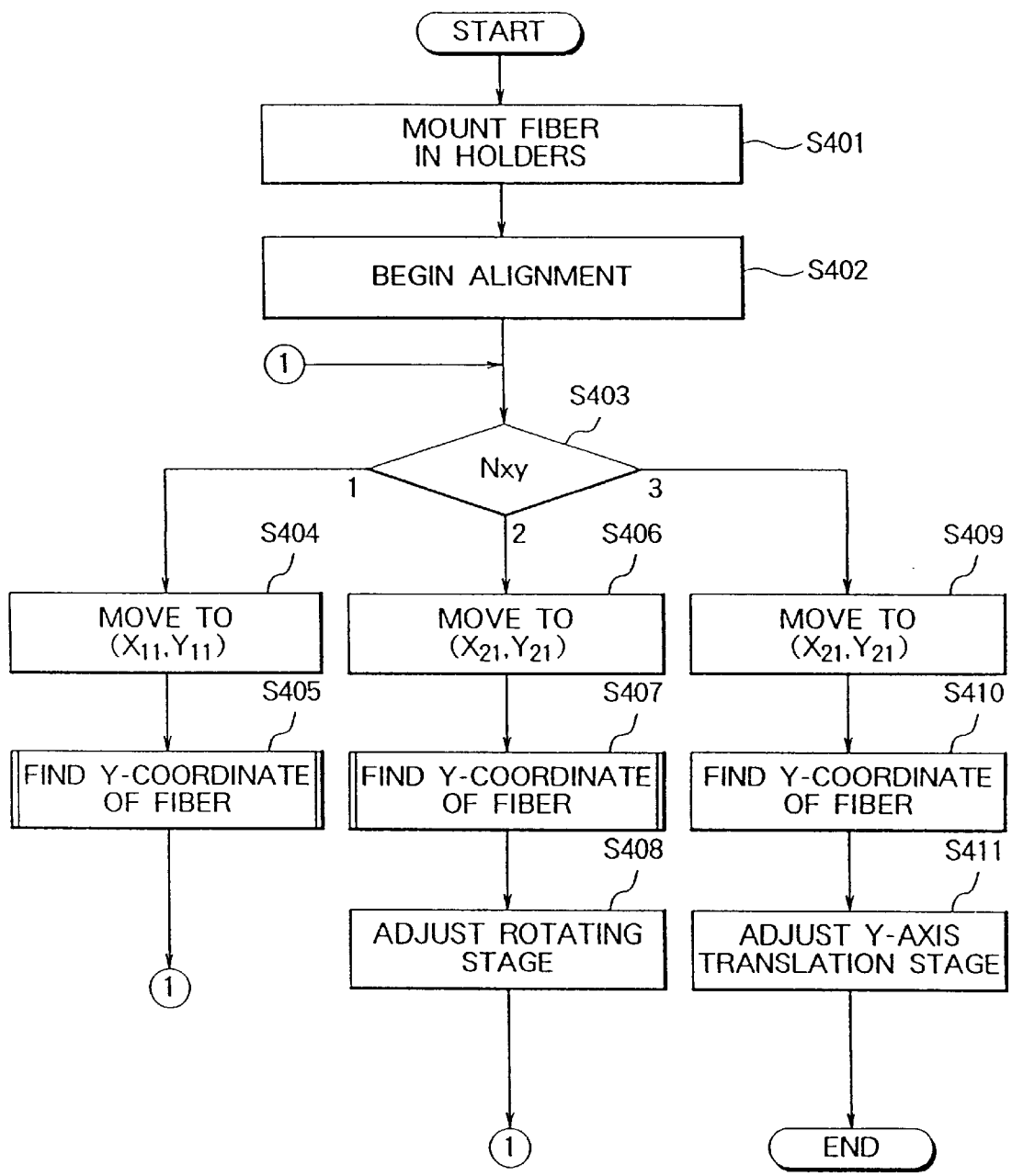
FIG. 8 is a flowchart illustrating the overall operation of the first embodiment.

Referring to FIG. 8, the initial alignment procedure starts with the mounting of the photosensitive optical fiber 12 in the fiber holders 30 on the base plate 28 in step S401. In this step the phase mask 10 is also secured to the fiber holders 30, so that the photosensitive optical fiber 12 is aligned with the long axis of the phase mask 10, along the dashed line marked X in FIG. 3, which is roughly aligned with the X-axis of the X-axis stage assembly 36.

In step S402, the computer 34 is given an alignment command. The succeeding steps are carried out under control of the computer 34. In the following description, the notation Nxy will denote a variable used by the computer 34 to keep track of the current stage of the operation. The initial value of Nxy is zero.

In step S403, Nxy is incremented by one, and tested to determine the next step. The first time step S403 is executed, the value of Nxy is incremented from zero to one, and the next step S404 is to move the X-axis translational stage 38 and Y-axis translational stage 24 to X-Y coordinates ($X_{11}$, $Y_{11}$) such that the ultraviolet beam is aimed at a point disposed in the negative Y-axis direction from the fiber, in the area between one end of the grating 20 of the phase mask 10 and one of the fiber holders 30. In this area, the ultraviolet beam $P_1$ passes through the phase mask 10 without being diffracted.

In the next step S405, the laser light source 2 is turned on, and the Y-axis translational stage 24 is driven to find the Y-coordinate at which the ultraviolet beam $P_1$ best illuminates the photosensitive optical fiber 12. This step is carried out by a procedure that will now be described in more detail, with reference to FIG. 9.

Figure 9:
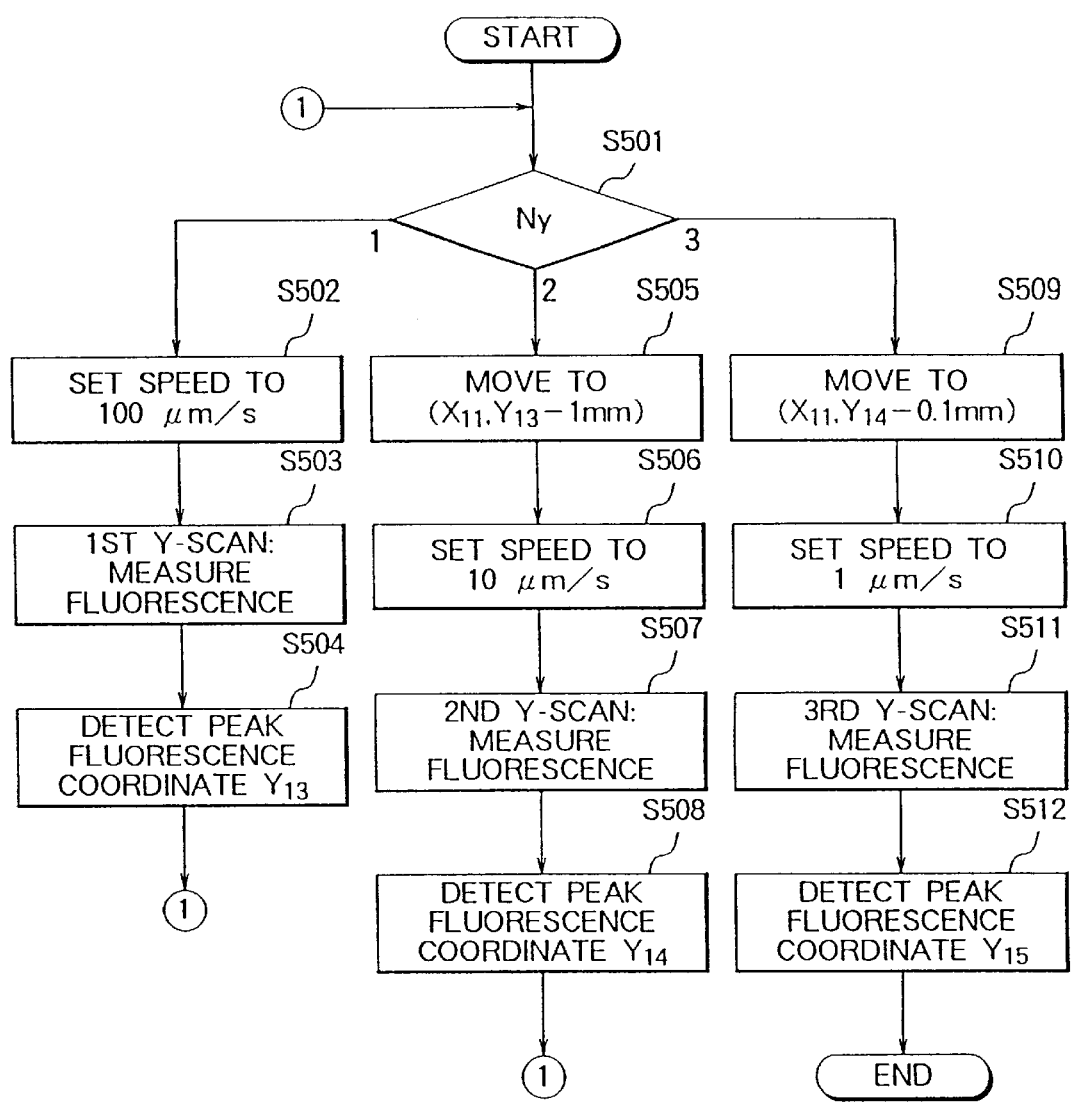
FIG. 9 is a flowchart illustrating the procedure for finding a Y-coordinate in the first embodiment.

The procedure in FIG. 9 is controlled by a variable Ny that is set to zero each time the procedure begins.

In the first step S501, Ny is incremented and tested to determine the next step. The first time step S501 is executed, Ny is incremented from zero to one, and in the next step S502, the scanning speed of the Y-axis translational stage 24 is set to one hundred micrometers per second (100 μm/s).

In the next step S503, the Y-axis translational stage 24 is driven so that the ultraviolet beam $P_1$ scans in the positive Y-axis direction from Y-coordinate $Y_{11}$ toward a Y-coordinate $Y_{12}$ on the other side of the photosensitive optical fiber 12. As this first scan is carried out, the computer 34 monitors the optical power measured by the optical transducer 32. At the end of the scan, in step S504, the computer 34 finds the Y-coordinate $Y_{13}$ at which the peak optical power value was detected. Since $Y_{13}$ is the Y-coordinate of peak fluorescence, $Y_{13}$ is approximately equal to the Y-coordinate at which the ultraviolet beam $P_1$ was centered on the photosensitive optical fiber 12.

The procedure then returns to step S501. The variable Ny is incremented and tested again, now producing a value of two. This sends the procedure to step S505, in which the Y-axis translational stage 24 is driven to a Y-coordinate one millimeter less than the Y-coordinate $Y_{13}$ at which peak fluorescence was detected. The ultraviolet beam $P_1$ is thus positioned at ($X_{11}$, $Y_{13}$–1 mm).

In the next step S506, the scanning speed of the Y-axis translational stage 24 is set to ten micrometers per second (10 μm/s). Then in step S507, the Y-axis translational stage 24 is driven at this speed to a Y-coordinate one millimeter greater than $Y_{13}$; that is, to ($Y_{13}$+1 mm). As this second scan is carried out, the computer 34 again monitors the optical power measured by the optical transducer 32. At the end of the scan, in step S508, the computer 34 finds a new Y-coordinate $Y_{14}$ at which peak optical power was detected.

The procedure then returns once more to step S501. The variable Ny is incremented and tested again, now producing a value of three. This sends the procedure to step S509, in which the Y-axis translational stage 24 is driven to a Y-coordinate one-tenth of one millimeter less than the Y-coordinate $Y_{14}$ at which the peak fluorescence was detected in the second scan. The ultraviolet beam $P_1$ is thus positioned at ($X_{11}$, $Y_{14}$–0.1 mm).

In the next step S510, the scanning speed of the Y-axis translational stage 24 is set to one micrometer per second (1 μm/s). Then in step S511, the Y-axis translational stage 24 is driven at this speed to a Y-coordinate one-tenth of one millimeter greater than the Y-coordinate $Y_{14}$ where the peak fluorescence was detected in the second scan; that is, to ($Y_{14}$+0.1 mm). As this third scan is carried out, the computer 34 once again monitors the optical power measured by the optical transducer 32. At the end of the scan, in step S512, the computer 34 stores the new Y-coordinate $Y_{15}$ at which the peak optical power was measured.

Because of the successively decreasing speeds of the three scans, the optical power measurements become increasingly accurate. The coordinates ($X_{11}$, $Y_{15}$) found in the last scan in the series are the X- and Y-coordinates at which a first point on the photosensitive optical fiber 12 is closely centered under the ultraviolet beam $P_1$.

Referring again to FIG. 8, step S403 is now executed once more, incrementing the variable Nxy and obtaining a value of two. This causes the execution of step S406, in which the X-axis translational stage 38 and Y-axis translational stage 24 are moved to coordinates ($X_{21}$, $Y_{21}$) These coordinates are also selected so that the ultraviolet beam $P_1$ lands on the phase mask 10 at a point outside the grating 20, slightly to one side of the photosensitive optical fiber 12. $X_{21}$ must be different from $X_{11}$, and a large difference is preferable.

In the next step S407, the procedure in FIG. 9 is carried out again, using X-coordinate $X_{21}$ instead of $X_{11}$, so that the ultraviolet beam $P_1$ crosses the photosensitive optical fiber 12 at a different location. Coordinates ($X_{21}$, $Y_{25}$) at which the ultraviolet beam $P_1$ is closely centered on a second point on the photosensitive optical fiber 12 are thereby obtained.

Figure 10:
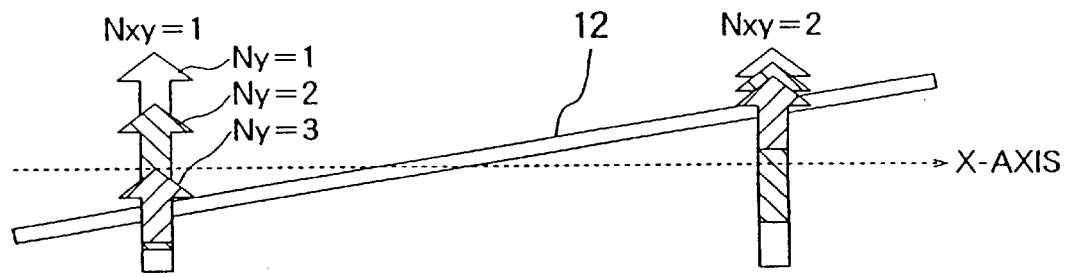
FIG. 10 is a plan view illustrating the first two series of scans performed in the first embodiment.

FIG. 10 illustrates the two series of scans performed in step S405 (Nxy=1) and step S407 (Nxy=2). Each series comprises three scans (Ny=1, 2, 3).

Figure 11:
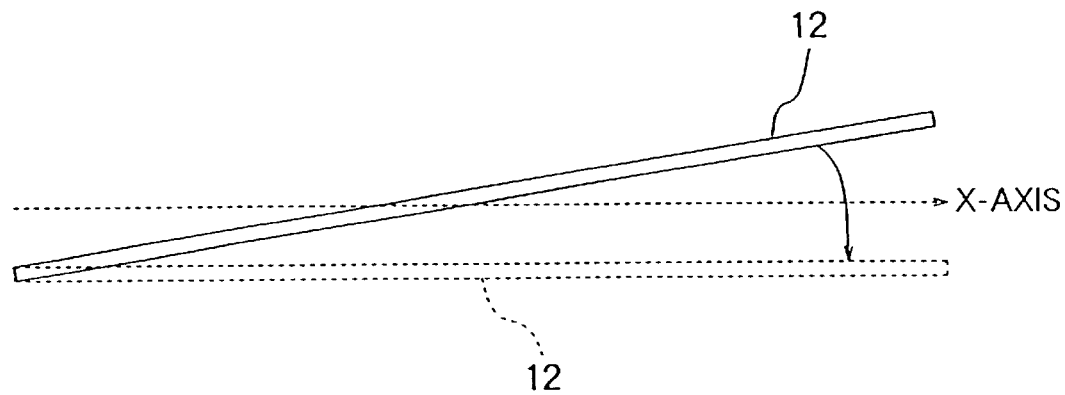
FIG. 11 is a plan view illustrating rotational alignment of the photosensitive optical fiber.

In the next step S408 in FIG. 8, from the coordinates ($X_{11}$, $Y_{15}$) and ($X_{21}$, $Y_{25}$) of the first and second points, the computer 34 calculates the angle θ between the X-axis of the X-axis stage assembly 36 and the axis of the photosensitive optical fiber 12, and controls the rotating stage 26 so as to reduce this angle to zero, as shown in FIG. 11. The photosensitive optical fiber 12 is now aligned parallel to the X-axis. The angle θ can be calculated by use of the arctangent function, as follows.

$$\theta = \arctan\{(Y_{25}-Y_{15})/(X_{21}-X_{11})\}$$

Step S403 in FIG. 8 is now executed for a third time, incrementing the variable Nxy and obtaining a value of three. This causes the execution of step S409, in which the X-axis translational stage 38 and Y-axis translational stage 24 are positioned again at coordinates $(X_{21}, Y_{21})$, causing the ultraviolet beam $P_1$ to land again at a point outside the grating 20 and slightly to one side of the photosensitive optical fiber 12.

Figure 12:
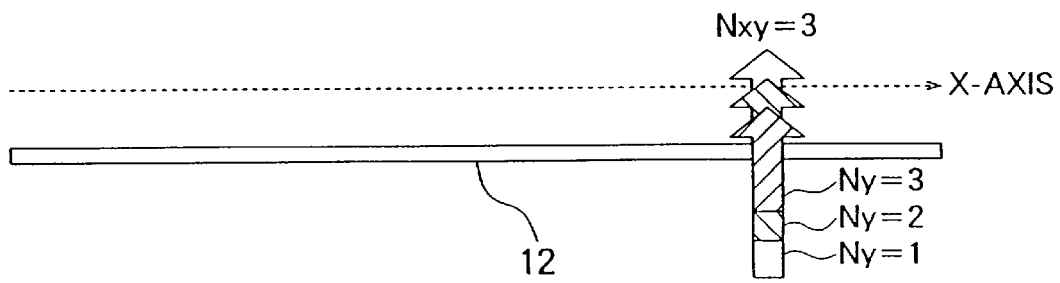
FIG. 12 is a plan view illustrating the third series of scans performed in the first embodiment.

In the next step S410, the procedure in FIG. 9 is carried out once more to find a third pair of coordinates $(X_{21}, Y_{35})$ at which the photosensitive optical fiber 12 is centered under the ultraviolet beam $P_1$. FIG. 12 illustrates the three Y-axis scans performed in this step. In step S411 in FIG. 8, the computer 34 causes the Y-axis translational stage 24 to move to Y-coordinate $Y_{35}$. The photosensitive optical fiber 12 is now aligned parallel to the X-axis and centered under the ultraviolet beam $P_1$, in the correct position to begin the X-axis scan that will form the Bragg grating.

The alterations to the refractive index of the core of the photosensitive optical fiber 12 made during the initial alignment procedure described above are comparatively small, because the ultraviolet beam is scanned across the photosensitive optical fiber 12 instead of lengthwise along the fiber core. Moreover, the ultraviolet beam is not diffracted, so no Bragg grating is formed during the initial alignment. Such alterations of the refractive index as occur during the initial alignment have substantially no effect on the final optical characteristics of the filter.

By performing angular alignment according to the coordinates $(X_{11}, Y_{15})$ and $(X_{21}, Y_{25})$, followed by Y-axis alignment according to $(X_{21}, Y_{35})$, the first embodiment is able to align the photosensitive optical fiber 12 accurately and automatically. By determining each pair of coordinates in a series of three successively shorter and slower scans, the first embodiment is able to obtain accurate coordinates in a reasonably short time.

Figure 13:
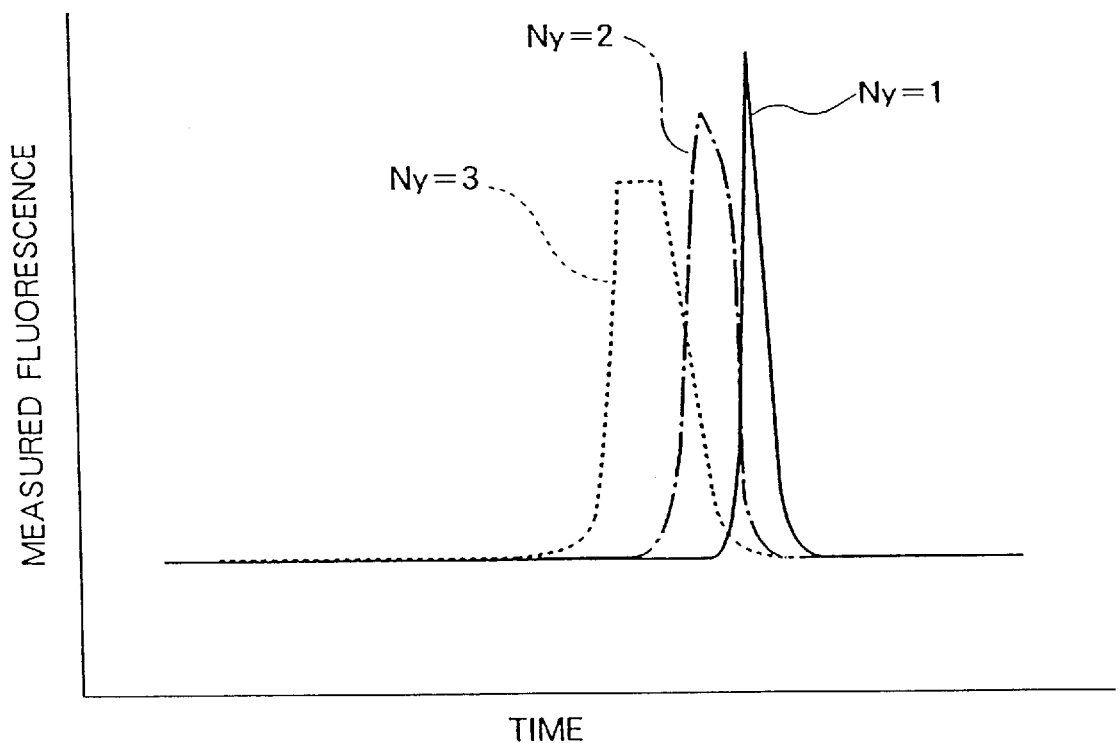
FIG. 13 is a graph illustrating data obtained during one series of scans in the first embodiment.

FIG. 13 illustrates fluorescence measurements obtained during one series of three scans. The horizontal axis represents time. The vertical axis represents the measured optical power of the fluorescence. Each of the three scans takes about the same length of time. Since the scanning speed decreases by a factor of ten from the first scan (Ny=1) to the second scan (Ny=2), and by a further factor of ten in the third scan (Ny=3), the spatial resolution of the coordinate data increases by a factor of ten in each scan. The third scan (Ny=3) is slow enough for the hat-top shape of the peak to be fully resolved.

Next, a second embodiment will be described. The second embodiment follows the same general initial alignment procedure as the first embodiment, shown in FIG. 8, but modifies the scanning procedure used to find coordinates in steps S405, S407, and S410. The modified procedure for finding the coordinates of the first point (step S405) will be described below with reference to FIG. 14.

Steps S801, S802, S803, and S804 are similar to steps S501, S502, S503, and S504 in the first embodiment. The variable Ny is incremented, the ultraviolet beam $P_1$ is scanned across the photosensitive optical fiber 12 at a speed of one hundred micrometers per second in the positive Y-axis direction, and the computer 34 finds the Y-coordinate $Y_{13}$ at which peak fluorescence is measured.

Steps S805, S806, S807, and S808 are similar to steps S505, S506, S507, and S508 in the first embodiment. The Y-axis translational stage 24 is controlled to position the ultraviolet beam $P_1$ at a Y-coordinate one millimeter less than $Y_{13}$, at $(X_{11}, Y_{13}-1$ mm); then the ultraviolet beam $P_1$ is scanned across the photosensitive optical fiber 12 at a speed of ten micrometers per second in the positive Y-axis direction, to the point with coordinates $(X_{11}, Y_{13}+1$ mm). The computer 34 finds and stores the Y-coordinate $Y_{14}$ at which the peak fluorescence is measured.

In step S809, the ultraviolet beam $P_1$ is positioned at a Y-coordinate one-tenth of one millimeter greater than $Y_{14}$, at $(X_{11}, Y_{14}+0.1$ mm). In step S810, the scanning speed is set to one micrometer per second (1 μm/s). In step S811, the ultraviolet beam $P_1$ is scanned at this speed in the negative Y-axis direction, to $(X_{11}, Y_{14}-0.1$ mm). In step S812 the computer 34 finds the Y-coordinate $Y_{15}$ at which peak fluorescence is measured during this scan. In step S813, the computer 34 computes the mean value $Y_{16}$ of the peak coordinate $Y_{14}$ obtained in the second scan (Ny=2) and the peak coordinate $Y_{15}$ obtained in the third scan (Ny=3). This mean value $Y_{16}$ is regarded as giving the true location of the fiber.

Figure 14:
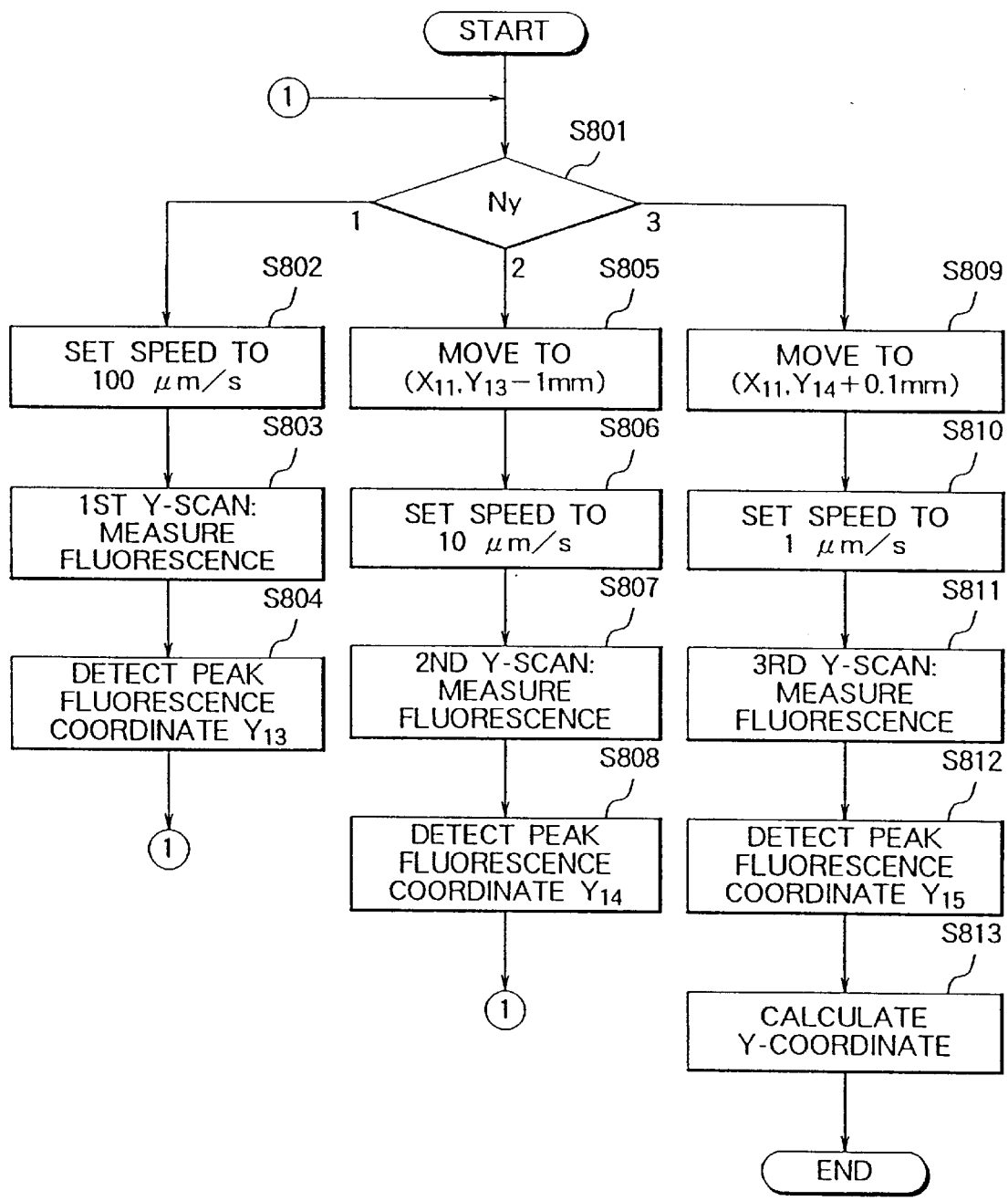
FIG. 14 is a flowchart illustrating the procedure for finding a Y-coordinate in a second embodiment.
Figure 15:
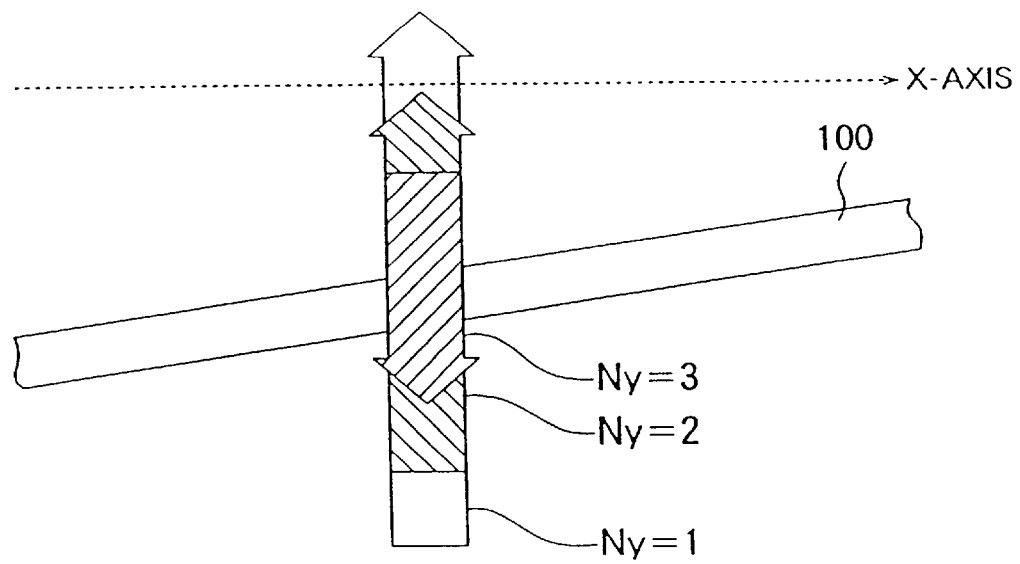
FIG. 15 is a plan view illustrating a series of scans performed in the second embodiment.
Figure 16:
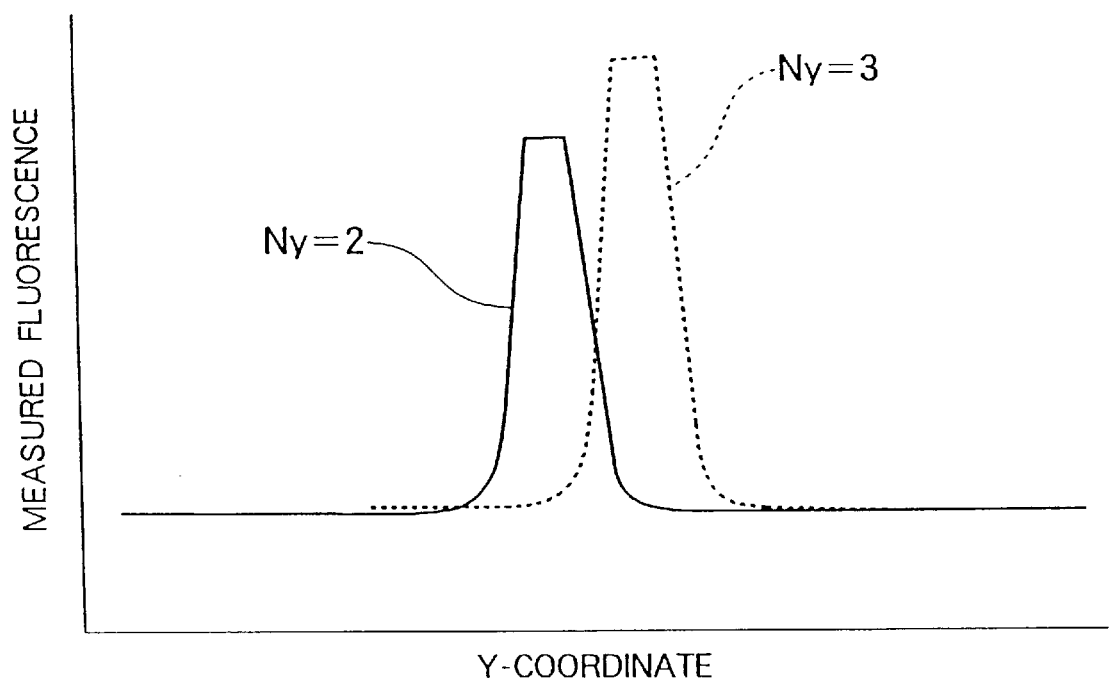
FIG. 16 is a graph illustrating data obtained during the last two scans in FIG. 15.

FIG. 15 illustrates the three scans (Ny=1, 2, 3) in the procedure in FIG. 14, showing that the second scan (Ny=2) and third scan (Ny=3) are performed in opposite directions. FIG. 16 shows examples of data obtained during the second and third scans. The vertical axis indicates the measured optical power of the fluorescence. The horizontal axis in FIG. 16 is a Y-coordinate axis; differing from FIG. 13, both scans are shown in terms of position coordinates, at the same spatial resolution.

The other series of scans, (in steps S407 and S410 in FIG. 8) are carried out in the same way, by scanning the ultraviolet beam $P_1$ twice in one direction, then once in the opposite direction, and taking the mean value of the peak Y-coordinates found in the second and third scans. These mean values are used in the position-adjusting steps (steps S408 and S411 in FIG. 8).

By taking the mean of two peak values obtained from scans in opposite directions, the second embodiment is able to reduce the effect of the time dependency of the fluorescence illustrated in FIG. 7, thereby improving the accuracy of the positional data.

Figure 17:
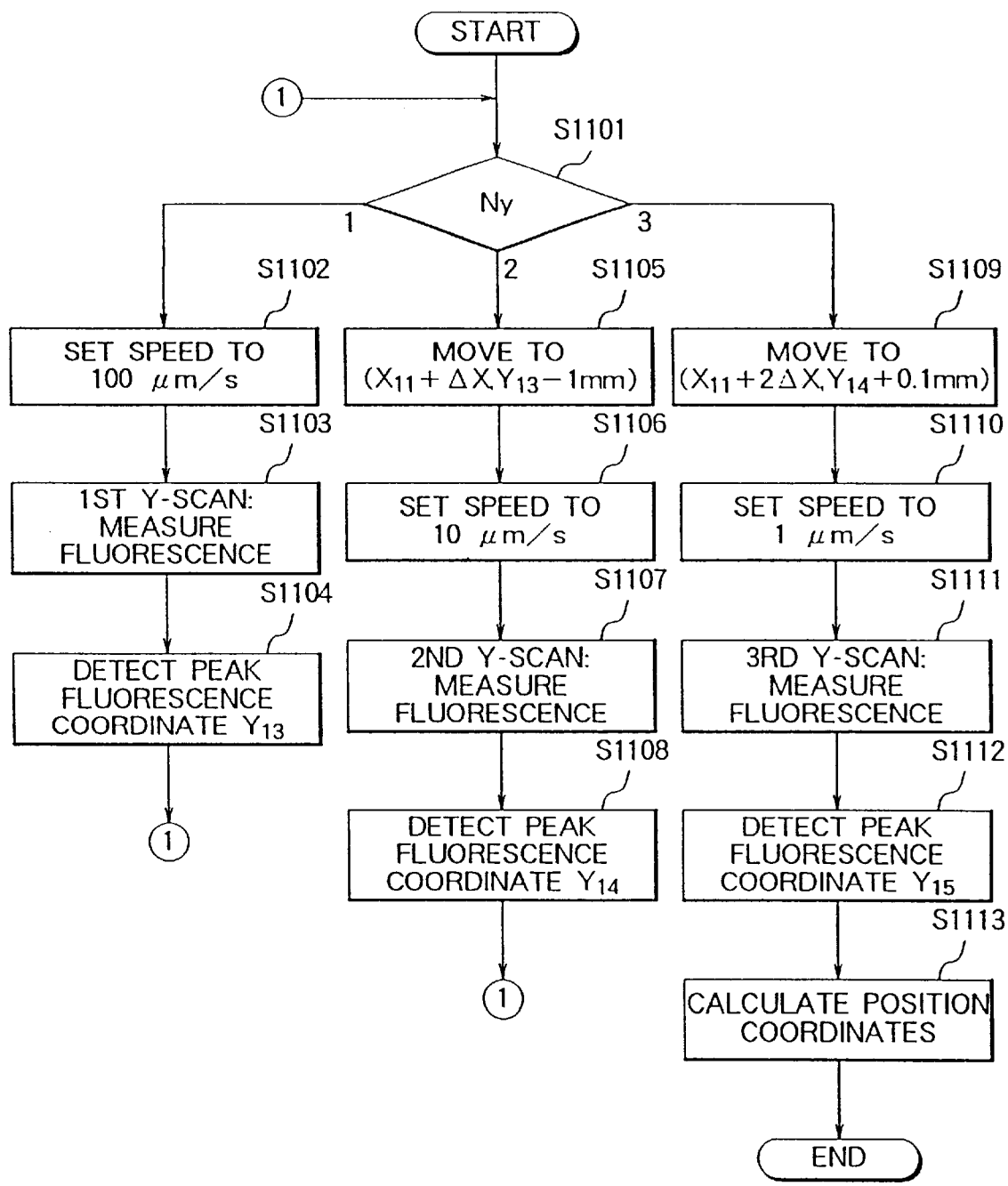
FIG. 17 is a flowchart illustrating the procedure for finding a Y-coordinate in a third embodiment.

Next, a third embodiment will be described. The third embodiment is generally similar to the second embodiment, but makes a further modification to the scanning procedure used in steps S405, S407, and S410 in FIG. 8. The modified procedure for step S405 is shown in FIG. 17.

Steps S1101, S1102, S1103, and S1104 are similar to steps S801, S802, S803, and S804 in the second embodiment. The variable Ny is incremented, the ultraviolet beam $P_1$ is scanned across the photosensitive optical fiber 12 at a speed of one hundred micrometers per second in the positive Y-axis direction, and the computer 34 finds the Y-coordinate $Y_{13}$ at which peak fluorescence is measured.

In step S1105, the X-axis translational stage 38 and Y-axis translational stage 24 are driven to coordinates differing from the peak fluorescence coordinates $(X_{11}, Y_{13})$ by one millimeter in the negative Y-axis direction and by an amount ΔX in the X-axis direction. ΔX is, for example, one half of one millimeter (+0.5 m). The ultraviolet beam $P_1$ is thus positioned at coordinates $(X_{11}+\Delta X, Y_{13}-1$ mm).

Steps S1106, S1107, and S1108 are similar to steps S806, S807, and S808 in the second embodiment. The ultraviolet beam $P_1$ is scanned from $(X_{11}+\Delta X, Y_{13}-1$ mm) to $(X_{11}+\Delta X, Y_{13}+1$ mm) at a speed of ten micrometers per second. The computer 34 stores the Y-coordinate ($Y_{14}$) at which peak fluorescence is measured.

In step S1109, the X-axis translational stage 38 and Y-axis translational stage 24 are driven to coordinates differing from the peak fluorescence coordinates ($X_{11}+\Delta X$, $Y_{14}$) of the second scan by one-tenth of one millimeter in the positive Y-axis direction and by the above amount $\Delta X$ in the X-axis direction. The ultraviolet beam $P_1$ is thus positioned at coordinates ($X_{11}+2\Delta X$, $Y_{14}+0.1$ mm)

Steps S1110, S1111, S1112, and S1113 are similar to steps S810, S811, S812, and S813 in the second embodiment. The ultraviolet beam $P_1$ is scanned from ($X_{11}+2\Delta X$, $Y_{14}+0.1$ mm) to ($X_{11}+2\Delta X$, $Y_{14}-0.1$ mm) at a speed of one micrometer per second. The computer 34 finds the Y-coordinate ($Y_{15}$) at which peak fluorescence is measured, then calculates the mean value $Y_{16}$ of this peak Y-coordinate ($Y_{15}$) and the peak Y-coordinate ($Y_{14}$) found in the second scan. The mean value ($X+1.5$ $\Delta X$) of the corresponding X-coordinates ($X+\Delta X$ and $X+2\Delta X$) is also calculated. The fiber is regarded as centered under the ultraviolet beam $P_1$ at these mean coordinates ($X+1.5$ $\Delta X$, $Y_{16}$).

Steps S407 and S410 in FIG. 8 are modified similarly, by moving the X-axis translational stage 38 through a distance $\Delta X$ between scans. The mean-value coordinates obtained from the second and third scans in each step are used in the adjustment steps (steps S408 and S411).

Figure 18:
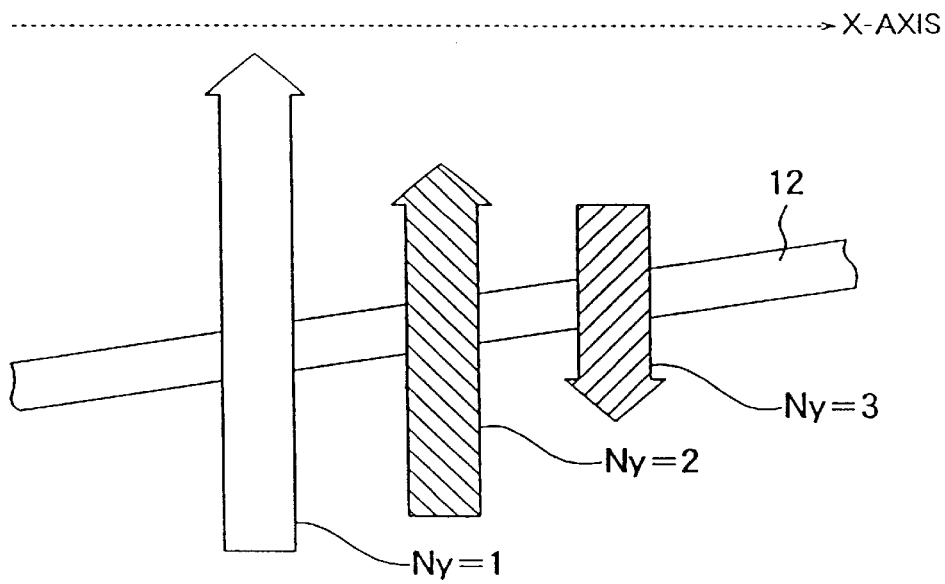
FIG. 18 is a plan view illustrating a series of scans performed in the third embodiment.
Figure 19:
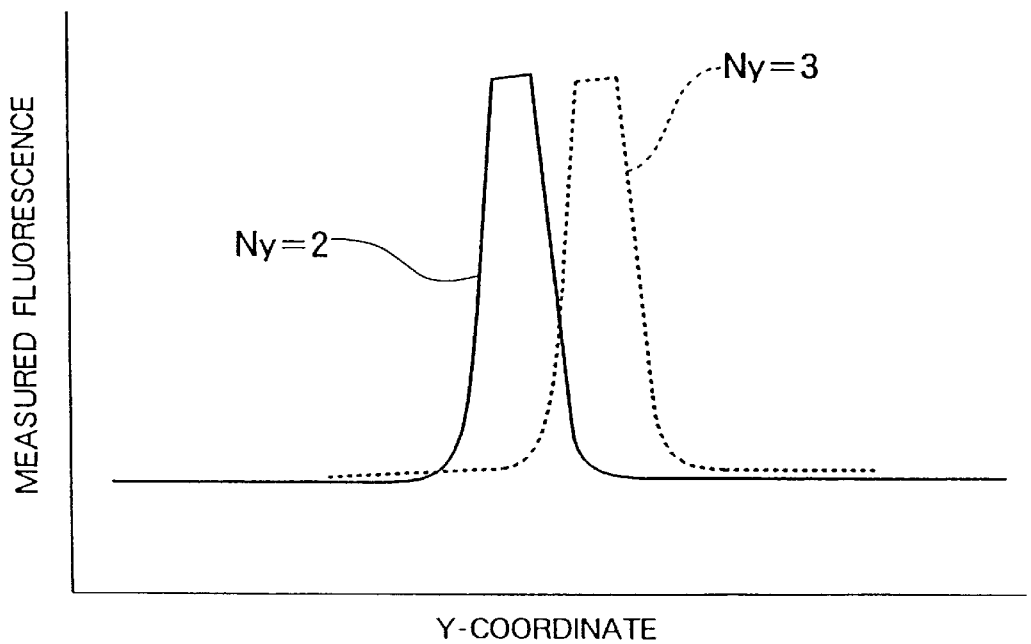
FIG. 19 is a graph illustrating data obtained during the last two scans in FIG. 18.

FIG. 18 illustrates the three scans (Ny=1, 2, 3) in the procedure in FIG. 17, showing that the photosensitive optical fiber 12 is crossed at points with three different X-coordinates. FIG. 16 shows examples of the data obtained during the second and third scans. The vertical axis indicates the measured optical power of the fluorescence, the horizontal axis is the Y-coordinate axis, and both scans are shown at the same spatial resolution.

The third embodiment eliminates memory effects, so that the amount of fluorescence measured in one scan is not affected by the amount of fluorescence already emitted from the same point in a previous scan. The positional data obtained in the third embodiment are accordingly even more accurate than the data in the second embodiment.

Next, a fourth embodiment will be described. The fourth embodiment also follows the general initial alignment procedure shown in FIG. 8, but modifies the scanning procedure used in steps S405, S407, and S410. The modified procedure for finding the first pair of coordinates (step S405) will be described below with reference to FIG. 20.

Steps S1401, S1402, and S1403 are similar to steps S501, S502, and S503 in the first embodiment. The ultraviolet beam $P_1$ is scanned across the photosensitive optical fiber 12 in the positive Y-axis direction at a speed of one hundred micrometers per second, and the optical power of the fluorescence is measured. The computer 34 stores all of the measured optical power data.

Figure 21:
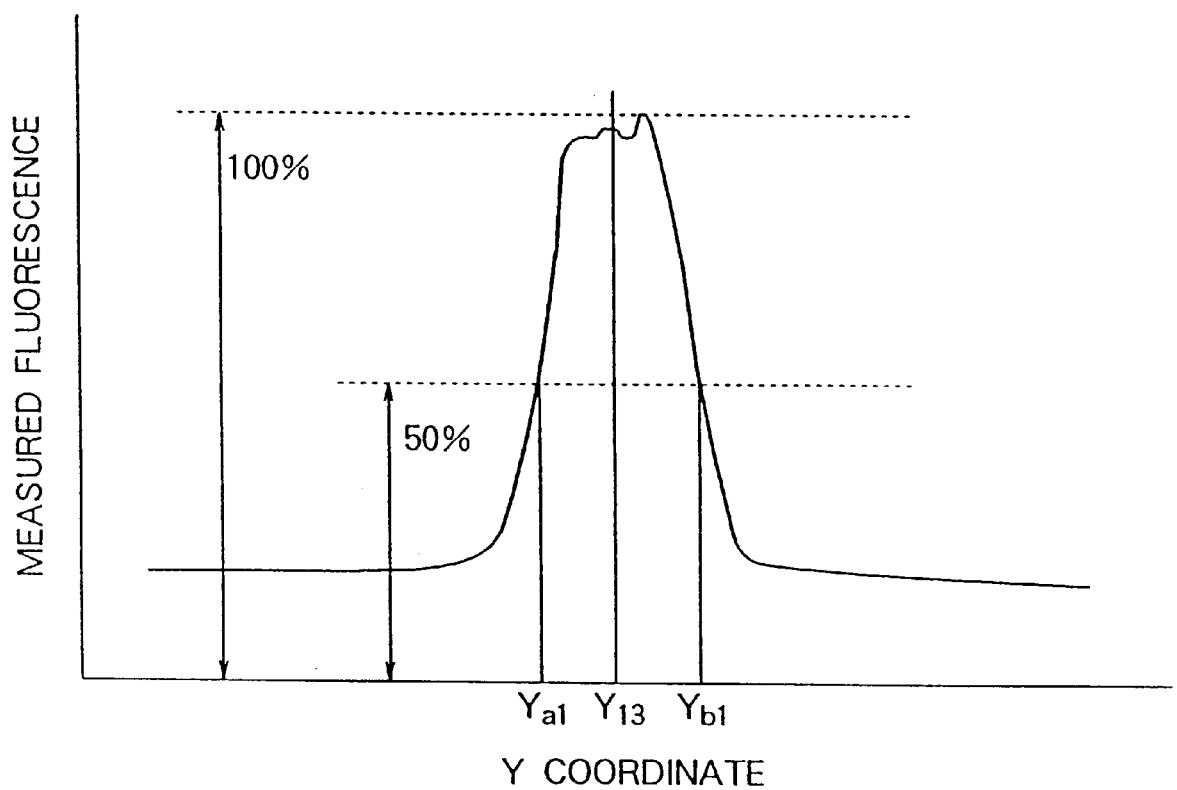
FIG. 21 is a graph illustrating the determination of a Y-coordinate in the fourth embodiment.

Step S1404 is illustrated in FIG. 21. From the data measured in step S1403, the computer 34 determines the half-power coordinates $Y_{a1}$ and $Y_{b1}$ of the fluorescence. The fiber is regarded as being centered halfway between these coordinates, at a Y-coordinate $Y_{13}$ equal to the mean value of $Y_{a1}$ and $Y_{b1}$.

$$Y_{13}=0.5Y_{a1}+0.5Y_{b1}$$

Figure 20:
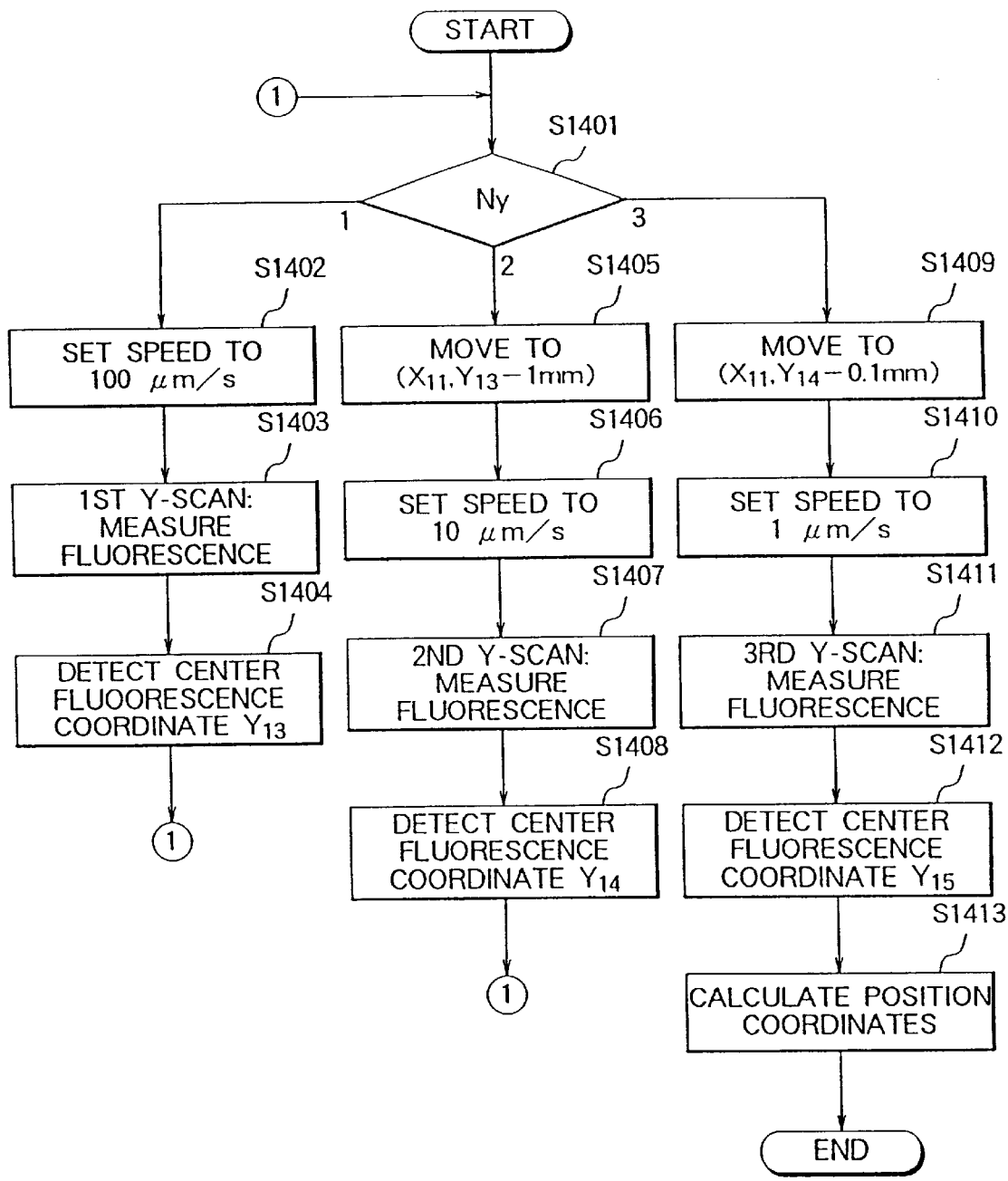
FIG. 20 is a flowchart illustrating the procedure for finding a Y-coordinate in a fourth embodiment.

Steps S1405, S1406, and S1407 in FIG. 20 are similar to steps S505, S506, and S507 in the first embodiment. The ultraviolet beam $P_1$ is scanned from ($X_{11}$, $Y_{13}-1$ mm) to ($X_{11}$, $Y_{13}+1$ mm) at a speed of ten micrometers per second, and the optical power values of the fluorescence are stored. Step S1408 is similar to step S1404: the computer 34 calculates and stores a center Y-coordinate $Y_{14}$ equal to the mean value of the two half-power coordinates in the data obtained in step S1407.

Steps S1409, S1410, and S1411 are similar to steps S509, S510, and S511 in the first embodiment. The ultraviolet beam $P_1$ is scanned from ($X_{11}$, $Y_{14}-0.1$ mm) to ($X_{11}$, $Y_{14}+0.1$ mm) at a speed of one micrometer per second, and the optical power data are stored. In step S1412, the computer 34 calculates another center Y-coordinate $Y_{15}$ equal to the mean value of the two half-power coordinates of the data obtained in step S1411. In step S1413, the computer 34 calculates a final Y-coordinate $Y_{16}$ by taking the mean value of the center coordinates $Y_{14}$ and $Y_{15}$ obtained in the second and third scans.

Similar procedures are used in steps S407 and S410 in FIG. 8, to obtain the coordinates used in adjusting the Y-θ stage assembly 22 in steps S408 and S411.

By taking the center coordinate between two half-power coordinates, the fourth embodiment can obtain accurate positional data despite the presence of noise in the optical power measurements. The fourth embodiment is particularly effective in extracting accurate positional information from optical power data having a noisy hat-top profile, as in the example shown in FIG. 21.

The fourth embodiment can be modified by omitting step S1413 and using the center coordinate $Y_{15}$ obtained in the third scan as the Y-coordinate of the fiber.

The second and third embodiments can be modified by taking the center coordinate between the two half-power coordinates, as in the fourth embodiment, instead of simply finding the peak coordinate in each scan.

The second, third, and fourth embodiments can be modified by taking a weighted average of the Y-coordinates $Y_{14}$ and $Y_{15}$ obtained in the second and third scans as the final Y-coordinate $Y_{16}$ instead of simply taking the mean value.

The number of scans in each series is not limited to three, but may be any number greater than one.

If the base plate 28 is coated so as to prevent reflection of ultraviolet light, the photosensitive optical fiber 12 can be held in contact with the base plate 28, instead of being suspended in midair.

Those skilled in the art will recognize that further variations are possible within the scope claimed below.

What is claimed is:

1. An alignment system for aligning a photosensitive optical fiber preparatory to formation of an optical filter by scanning of the photosensitive optical fiber with an ultraviolet beam, comprising:

at least one fiber holder for holding said photosensitive optical fiber in a plane having an X-axis and a Y-axis, said photosensitive optical fiber being held in a straight line not parallel to said Y-axis;

a first scanning stage for causing said ultraviolet beam to scan said plane parallel to said X-axis;

a second scanning stage for causing said ultraviolet beam to scan said plane parallel to said Y-axis;

a third scanning stage coupled to said fiber holder, for rotating said photosensitive optical fiber about an axis perpendicular to said X-axis and said Y-axis;

an optical transducer for detecting light returned from said photosensitive optical fiber when illuminated by said ultraviolet beam; and a computing device coupled to said first scanning stage, said second scanning stage, said third scanning stage, and said optical transducer, for controlling said second scanning stage to perform a first series of scans of said ultraviolet beam across said photosensitive optical fiber at successively decreasing speeds, determining a first X-coordinate and a first Y-coordinate from the light detected by said optical transducer during said first series of scans, controlling said first scanning stage to move to a different location on said X-axis, controlling said second scanning stage to perform a second series of scans of said ultraviolet beam across said photosensitive optical fiber at successively decreasing speeds, determining a second X-coordinate and a second Y-coordinate from the light detected by said optical transducer during said second series of scans, and controlling said third scanning stage to rotate said photosensitive optical fiber through an angle determined from said first X-coordinate, said first Y-coordinate, said second X-coordinate, and said second Y-coordinate.

2. The alignment system of claim 1, wherein said angle aligns said photosensitive optical fiber parallel to said X-axis.

3. The alignment system of claim 1, wherein after controlling said third stage, said computing device controls said second scanning stage to perform a third series of scans of said ultraviolet beam across said photosensitive optical fiber at successively decreasing speeds, determines a third Y-coordinate from the light detected by said optical transducer during said third series of scans, then controls said second scanning stage according to said third Y-coordinate to align said photosensitive optical fiber with said ultraviolet beam.

4. The alignment system of claim 1, wherein said optical transducer detects light emitted by fluorescence when said photosensitive optical fiber is illuminated by said ultraviolet beam.

5. The alignment system of claim 1, wherein the scans in said first series are performed in mutually indentical directions.

6. The alignment of system claim 1, wherein at least two of the scans in said first series are performed in mutually opposite directions.

7. The alignment system of claim 1, wherein the scans in said first series are performed at a fixed X-coordinate.

8. The alignment system of claim 1, wherein the scans in said first series are performed at different X-coordinates.

9. The alignment system of claim 8, wherein said computing device determines said X-coordinate as a mean value of the X-ccordinates in at least two of the scans in said first series.

10. The alignment system of claim 1, wherein said computing device determines said first Y-coordinate from a last scan in said first series.

11. The alignment system of claim 1, wherein said computing device determines said first Y-coordinate from a last two scans in said first series.

12. The alignment system of claim 11, wherein said computing device determines said first Y-coordinate as a mean value of Y-coordinates found in said last two scans.

13. The alignment system of claim 1, wherein said computing device determines said first Y-coordinate by finding a coordinate at which peak light power is detected by said optical transducer during at least one of the scans in said first series.

14. The alignment system of claim 1, wherein said computing device determines said first Y-coordinate by finding a coordinate centered between a pair of half-power coordinates of the light detected by said optical transducer during at least one of the scans in said first series.

* * * * *

UNITED STATES PATENT AND TRADEMARK OFFICE
CERTIFICATE OF CORRECTION

PATENT NO. : 6,307,617 B1
DATED : October 23, 2001
INVENTOR(S) : Akihiko Nishiki and Kozo Fujii It is certified that error appears in the above-identified patent and that said Letters Patent is hereby corrected as shown below:

<u>Title page,</u>
Item [54], Title, should read -- INITIAL ALIGNMENT METHOD AND SYSTEM FOR USE IN MANUFACTURING AN OPTICAL FILTER --

Signed and Sealed this

Third Day of December, 2002

JAMES E. ROGAN
*Director of the United States Patent and Trademark Office*